US 6,570,755 B2

(12) United States Patent
Curlee et al.

(10) Patent No.: US 6,570,755 B2
(45) Date of Patent: May 27, 2003

(54) TONGUE AND GROOVE GASKET SEAM FOR EMI

(75) Inventors: James D. Curlee, Round Rock, TX (US); Richard Worley, Cedar Park, TX (US); Jason Alan Shepherd, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 155 days.

(21) Appl. No.: 09/885,368

(22) Filed: Jun. 20, 2001

(65) Prior Publication Data

US 2002/0195908 A1 Dec. 26, 2002

(51) Int. Cl.$^7$ .................................................. G06F 1/20
(52) U.S. Cl. .................... 361/683; 361/727; 439/710
(58) Field of Search ................... 361/683, 680–682, 361/684–687, 724–727; 439/541.5, 607, 710; 312/223.1–223.6

(56) References Cited

U.S. PATENT DOCUMENTS

| 5,337,464 A |   | 8/1994  | Steffes ........................ 29/401.1 |
|-------------|---|---------|-------------------------------------------|
| 5,347,430 A |   | 9/1994  | Curlee et al. ................ 361/816    |
| 5,438,476 A |   | 8/1995  | Steffes ......................... 361/683 |
| 5,661,640 A |   | 8/1997  | Mills et al. .................. 361/801   |
| 5,761,034 A | * | 6/1998  | Chu ............................ 361/687   |
| 6,276,963 B1| * | 8/2001  | Avery et al. ............. 439/541.5       |
| 6,498,727 B2| * | 12/2002 | Carr ........................... 361/725   |

* cited by examiner

Primary Examiner—Darren Schuberg
Assistant Examiner—Hung Van Duong
(74) Attorney, Agent, or Firm—Haynes and Boone, LLP

(57) ABSTRACT

A computer chassis includes a metal chassis base portion and a metal chassis top portion. A pivotal connection is provided between the top portion and the base portion for movement of the top portion between an open position and a closed position with the base portion. A tongue and groove edge connection extends between the top portion and the base portion. An adhesive free gasket is mounted in the groove for sealing engagement with the tongue.

20 Claims, 6 Drawing Sheets

TONGUE AND GROOVE GASKET SEAM FOR EMI

BACKGROUND

The disclosures herein relate generally to a computer system and more particularly to an EMI seal for a computer system chassis.

Increasing processor speeds are requiring improved electromagnetic interference (EMI) containment by a metal enclosure. The inability of individual metal fingers to be manufactured on a spacing that would be effective at the higher frequencies requires a continuous gasket.

Prior methods used to contain emissions include metal fingers made of various materials. The metal fingers can only be produced at large incremental spacing preventing the enclosure from providing a continuous EMI seal. Other methods are to use a tongue and groove concept to provide a labyrinth wave-guide to contain the emissions. The issue with these types of seals is intermittent contact at the seams. This creates larger problems than having no contact at all.

An EMI gasket has been used in various applications over the past few years. The gasket is typically applied using an adhesive. Adhesive adds cost and does not protect the gasket from abuse. The gasket adhesive is typically non-conductive which negatively affects the total surface area for gasket to metal chassis contact. Other applications require multiple parts to protect the gasket from customer abuse.

Therefore, what is needed is a chassis which limits the number of parts, creates a seal using a gasket and limits exposure to sharp edges.

SUMMARY

One embodiment, accordingly, provides a chassis seal which includes a gasket that does not require an adhesive. To this end, a computer chassis includes a metal chassis base portion and a metal chassis top portion. A pivotal connection is provided between the top portion and the base portion for movement of the top portion between an open position and a closed position with the base portion. A tongue and groove edge connection extends between the top portion and the base portion. An adhesive free gasket is mounted in the groove for sealing engagement with the tongue.

A principal advantage of this embodiment is that the gasket seal enhances EMI containment within the metal chassis.

DETAILED DESCRIPTION

Figure 1:
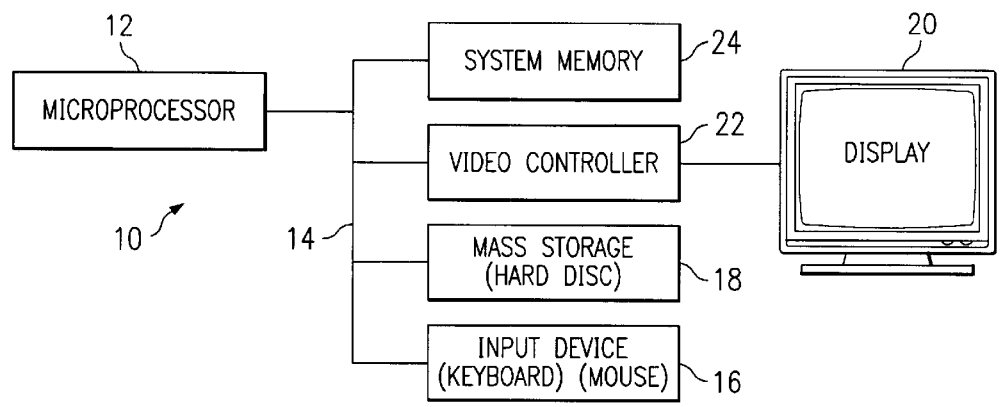
FIG. 1 is a diagrammatic view illustrating an embodiment of a computer system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
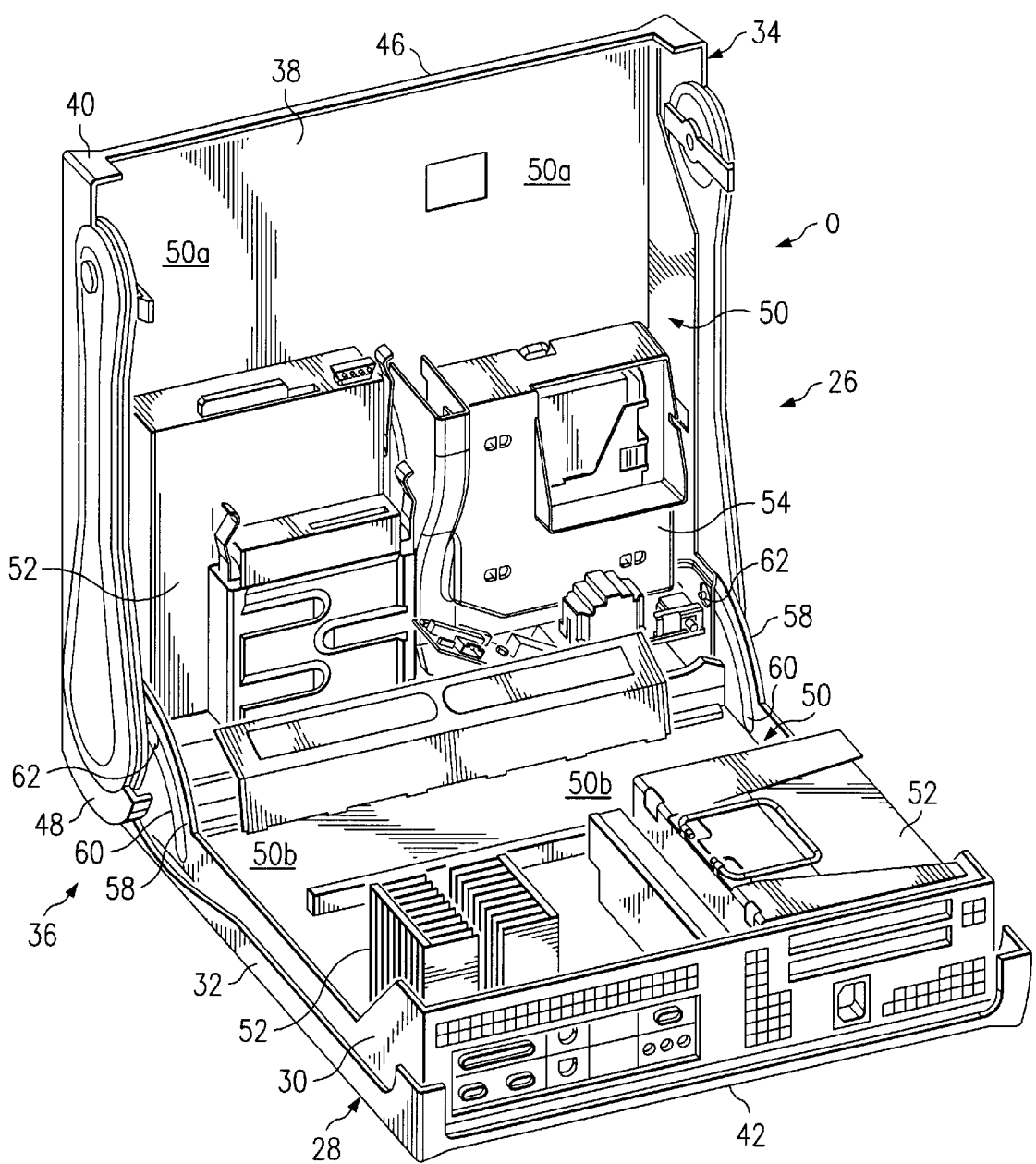
FIG. 2 is a perspective view illustrating an embodiment of a chassis in an open position.

A chassis 26, FIG. 2, is provided to support all or most of the components of system 10, as set forth above. Chassis 26 includes a base portion 28 formed of a metal portion 30 and a cosmetic cover 32. A top portion 34 of chassis 26 is pivotally connected to base portion 28 at a hinge connection generally designated 36. Top portion 34 includes a metal portion 38 and a cosmetic cover 40. The base portion 28 includes a base surface 42. The cosmetic cover 40 includes a top surface 46 and an endwall 48. The base portion 28 forms part of a cavity 50 in chassis 26 for containing a plurality of first computer components 52, and the top portion 34 forms another part of the cavity 50 for containing a plurality of second computer components 54.

Figure 3:
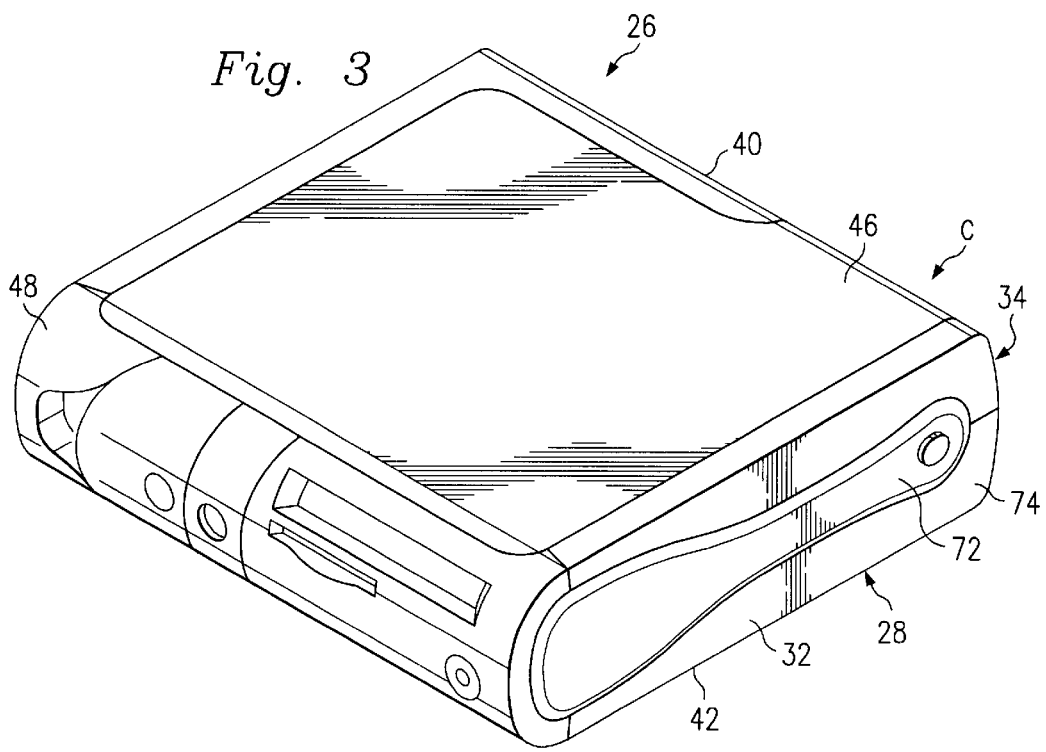
FIG. 3 is a perspective view illustrating the chassis in a closed position.

The hinge connection 36 permits the top portion 34 to pivot to an open position O about 90° relative to base portion 28, and to pivot to a closed position C, FIG. 3, wherein the top portion 34 and base portion nest together to define the cavity 50. It is understood that the open position O may be more or less than 90° as desired.

Figure 4:
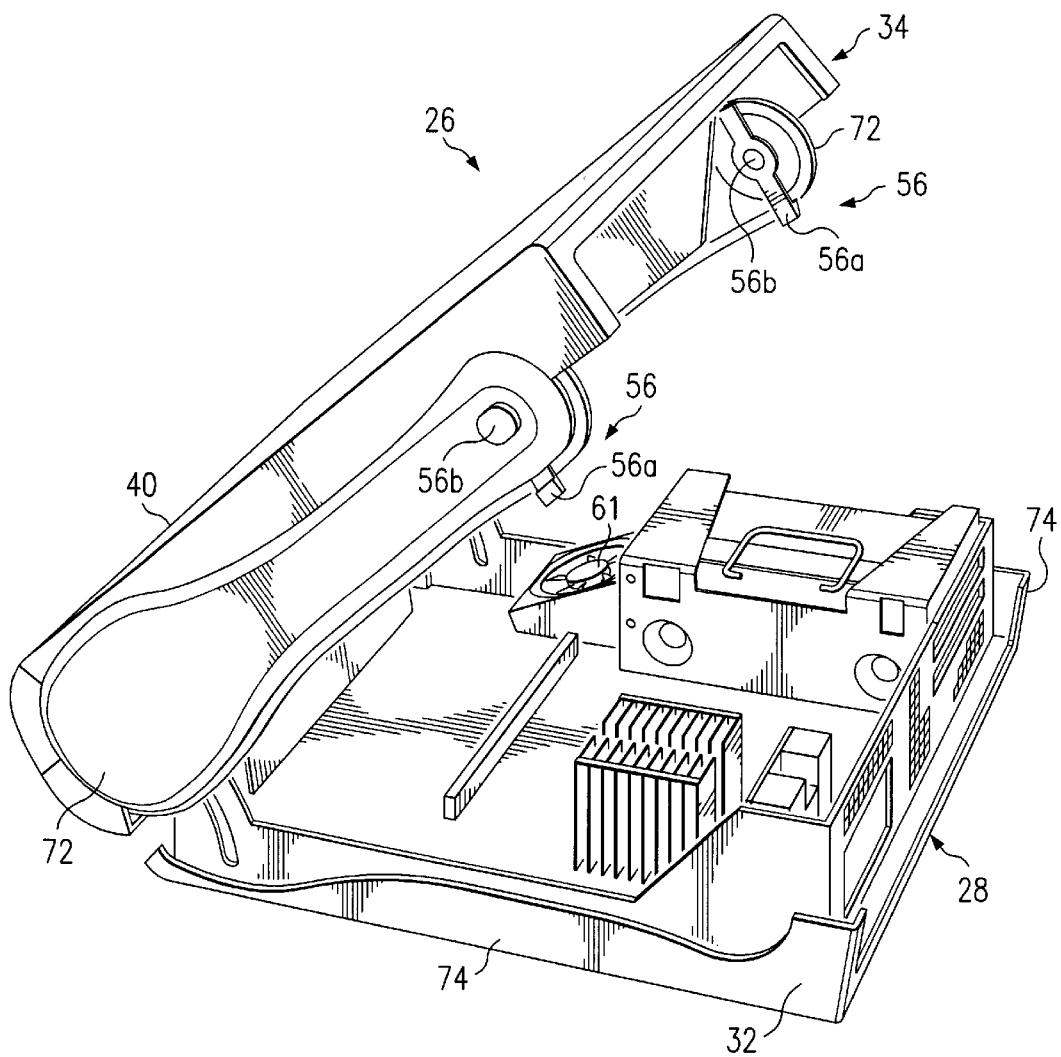
FIG. 4 is another perspective view illustrating the chassis in the open position.

A pair of side panels 72, FIGS. 3 and 4, of top cosmetic cover 40 are configured to nest with a complimentary configured pair of side panels 74 of base cosmetic cover 32 when chassis 26 is in the closed position C. When closed, the top portion 34 is automatically secured to the base portion 28 by a releasable latch 56, extending from each side panel 72 of top portion 34, which includes a latch member 56a and a release button 56b which permits latch member 56a to disengage from base portion 28.

Pivotal movement of top portion 34, FIG. 2, relative to base portion 28 is assisted by the hinge connection 36 including a pair of arcuate guides 58 attached to base portion 28. A groove 60 in guides 58 receives a pin 62 attached to top portion 34 for sliding movement in groove 60.

Figure 5:
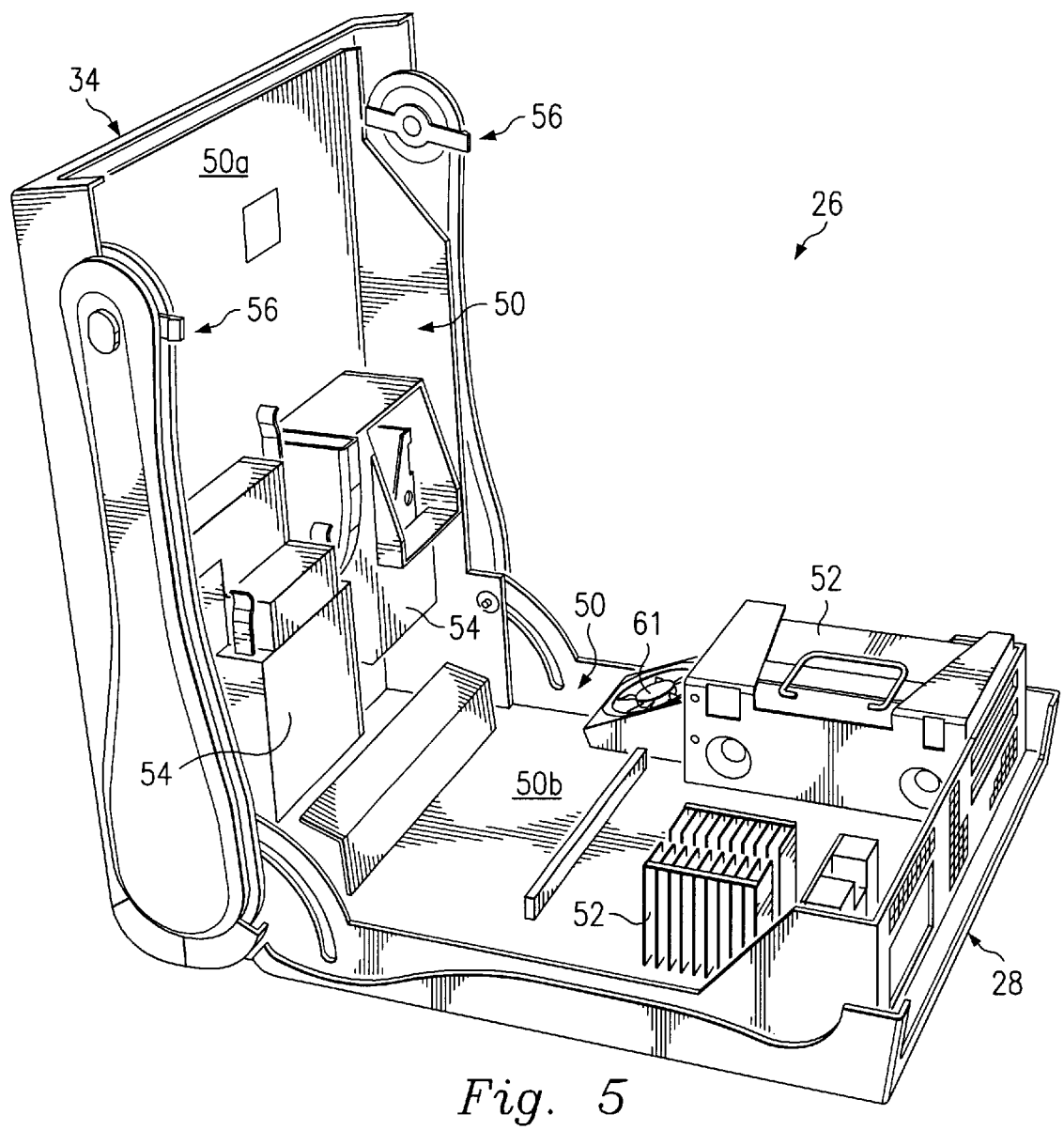
FIG. 5 is a further perspective view illustrating the chassis in the open position.

First components 52, FIG. 5, are positioned in base portion 28, and second components 54 are positioned in top portion 34 so that when chassis 26 is closed, a void area 50a of cavity 50 in top portion 34, is filled with first components 52. Likewise, a void area 50b of cavity 50 in base portion 28, is filled with second components 54. In this manner, when chassis 26 is closed, first components 52 are nested side-by-side with second components 54. This also ensures that when chassis 26 is opened, access to components 52, 54 is enhanced, and when chassis 26 is closed, space in cavity 50 is maximally utilized. For example, second components 54 in top portion 34 are positioned adjacent a fan 61 in base portion 28 for cooling, thus enhancing the mutually complimentary arrangement of components in chassis 50. Furthermore, when chassis 50 is opened, there is no requirement to remove the cosmetic covers from the metal chassis frame, only disengagement of latch 56 is required.

Figure 6:
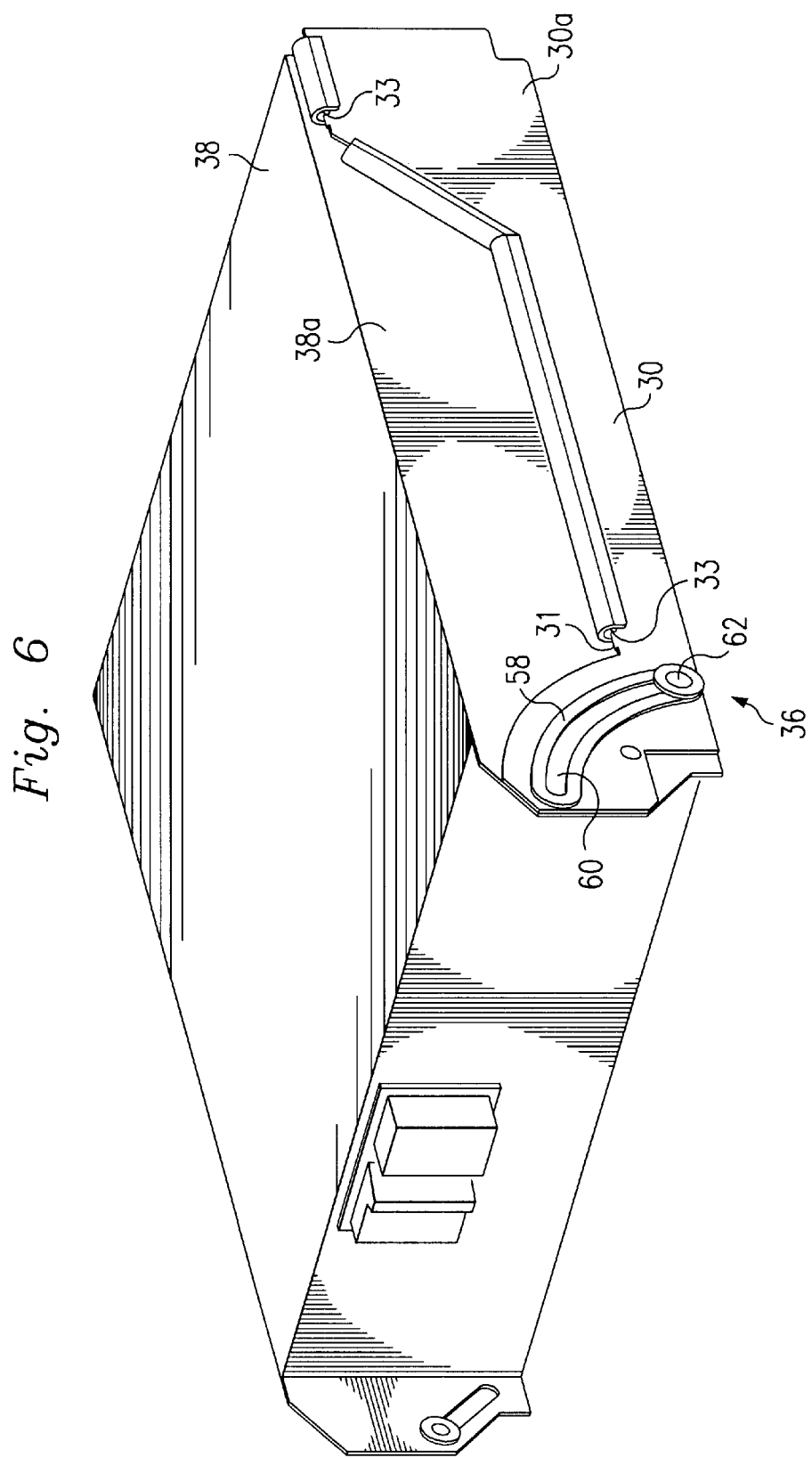
FIG. 6 is a perspective view illustrating an embodiment of a metal portion of the chassis.

In FIG. 6, the metal chassis is illustrated including the metal base portion 30 and the metal top portion 38. The hinge 36 is also illustrated including one of the arcuate guides 58, including groove 60, in the metal base portion 30, and one of the pins 62 attached to the metal top portion 38. This enables the top metal portion 38 to pivot relative to the base metal portion 30 between the open position O and the closed position C, as described above.

Figure 7:
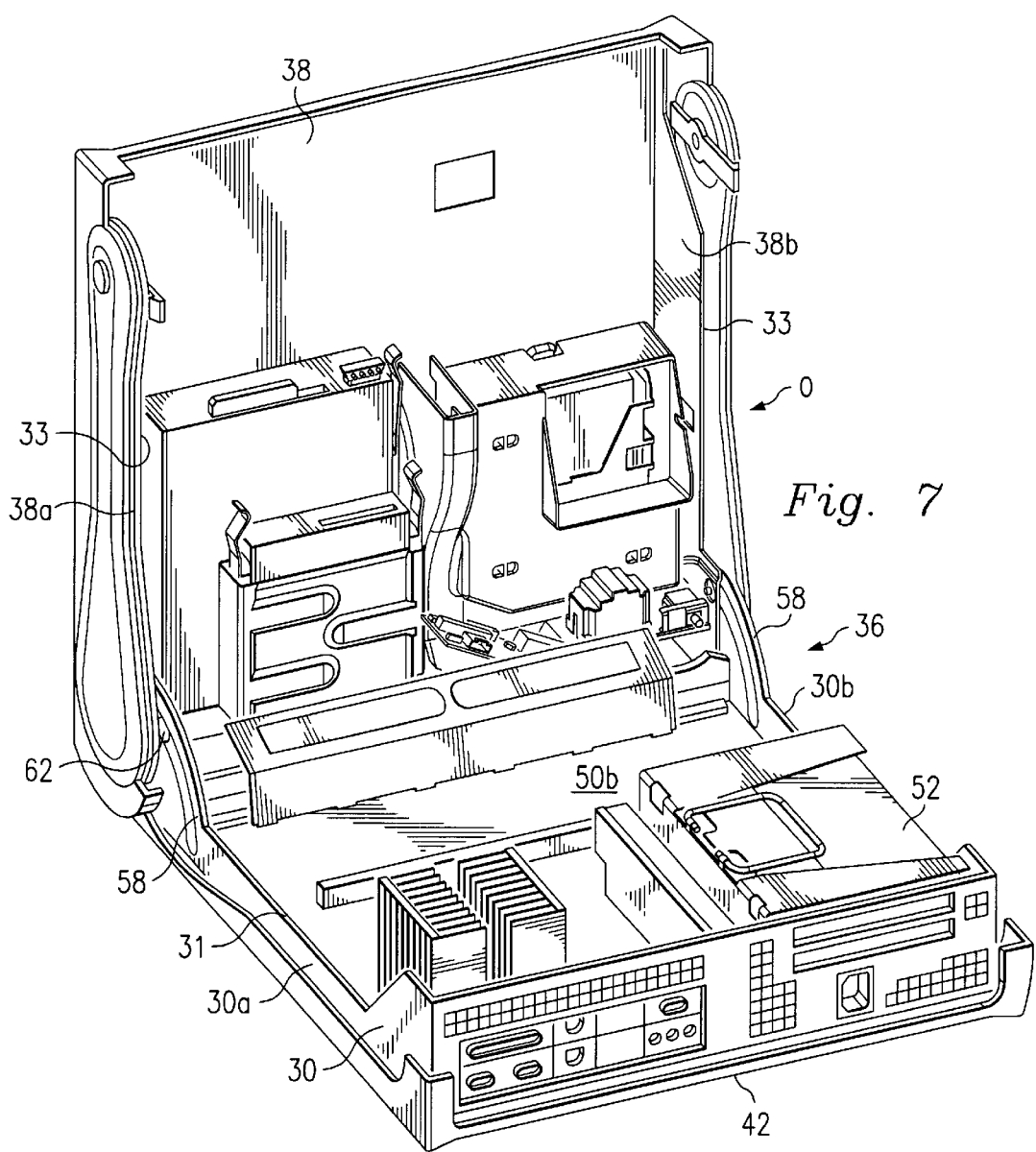
FIG. 7 is a perspective view illustrating an embodiment of the chassis in the open position.
Figure 8:
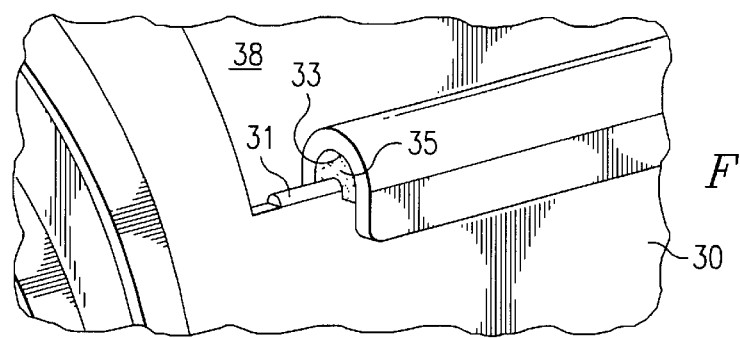
FIG. 8 is a perspective view illustrating a sealing gasket in a tongue and groove engagement of the metal portion of the chassis.

The metal base portion 30 includes a pair of opposed base sidewalls 30a, 30b, FIGS. 6 and 7, and the metal top portion 38 includes a pair of opposed top sidewalls 38a, 38b. The sidewalls 30a, 30b, respectively matingly engage the sidewalls 38a, 38b. Preferably, the base sidewalls 30a, 30b include a tongue 31 and the top sidewalls 38a, 38b include a groove 33, see also FIG. 8. A gasket 35 is compressed into groove 33 so that a potentially harmful adhesive is not required to maintain the gasket 35 in place. Thus, when the tongue 31 seats in groove 33, tongue 31 is sealingly engaged with gasket 35. Gasket 35 is preferably a fabric over foam EMI gasket sold under the name Foam Tite® by Advanced Performance Materials, Inc. of St. Louis, Mo.

As a result, one embodiment provides a computer chassis comprising a base portion formed of a metal chassis and a top portion formed of a metal chassis. A pivotal connection is provided between the top portion and the base portion and the top portion is pivotable relative to the base portion to an open position. A tongue and groove connection is provided between the top and base portions. An adhesive free gasket is mounted in the groove for sealing engagement with the tongue.

Another embodiment provides a computer chassis comprising a base portion formed of a metal chassis and a cosmetic cover; a top portion formed of a metal chassis and a cosmetic cover; a plurality of first computer components mounted in the base portion of the metal chassis; a plurality of second computer components mounted in the top portion of the metal chassis; and a pivotal connection between the top portion and the base portion, whereby a single pivotable movement of the top portion relative to the base portion to an open position, immediately exposes all of the first and second computer components for access, without removing any of the cosmetic covers; a tongue and groove edge connection between the top and base portions of the metal chassis; and an adhesive free gasket mounted in the groove for sealing engagement with the tongue.

A further embodiment provides a computer system comprising a chassis having an internal computer component cavity defined therein; a microprocessor mounted in the chassis; a storage coupled to the microprocessor; a video controller coupled to the microprocessor; a memory coupled to provide storage to facilitate execution of computer programs by the microprocessor; a base portion of the chassis formed of a metal portion and a cosmetic cover; a top portion of the chassis formed of a metal portion and a cosmetic cover; a plurality of first computer components mounted in the base portion; a plurality of second computer components mounted in the top portion; a pivotal connection between the top portion and the base portion; and the top portion being pivotable relative to the base portion to an open position immediately exposing the cavity and the plurality of first and second computer components for access, without removing any of the cosmetic covers; a tongue and groove edge connection between the top and base portions of the metal chassis; and an adhesive free gasket in the groove for sealing engagement with the tongue.

As it can be seen, the principal advantages of these embodiments are that the metal chassis is structured to protect the gasket, eliminates multiple parts, creates a continuous seal, and limits sharp edges on the chassis. The chassis base and top incorporates hemmed edges to create a tongue and groove around the peripheral of the chassis. This creates a continuous tongue and groove seal improving the overall chassis shielding effectiveness drastically. As a result of the increased geometric contact, we obtain a drop in inductance (L). Therefore, E-field escaping from the EMI gasket junction decreases. The resistance (R) decreases due to the increased surface contact decreasing emissions from the junction. Thus, the tongue and groove should be more efficient at shunting surface current (I). Adding the EMI gasket results in improved RE shielding effectiveness of an enclosure. It also is done without numerous parts or adhesive, reducing the cost drastically. The hemmed edges limit sharp edges from exposure.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. A computer chassis comprising:
a metal chassis base portion and a base cosmetic cover;
a metal chassis top portion and a top cosmetic cover;
a pivotal connection between the top portion and the base portion for movement of the top portion and the top cosmetic cover between an open position and a closed position with the base portion and the base cosmetic cover;
a tongue and groove edge connection between the top portion and the base portion; and
an adhesive free gasket mounted in the groove for sealing engagement with the tongue.

2. The chassis as defined in claim 1 wherein the metal chassis base portion includes a first pair of opposed sidewalls and the metal chassis top portion includes a second pair of opposed sidewalls matingly engaged with the first pair of side walls.

3. The chassis as defined in claim 1 wherein the pivotal connection includes arcuate guides on the base portion.

4. The chassis as defined in claim 1 wherein the top and base portions of the cosmetic cover include panels which nest together when the top portion of the metal chassis is pivoted into engagement with the base portion of the metal chassis in a closed position, and wherein the first computer components are nested side-by-side with the second computer components when the top and base portions of the metal chassis are in the closed position.

5. The chassis as defined in claim 2 wherein one of the first and second pair of sidewalls includes the tongue and the other of the first and second pair of sidewalls includes the groove.

6. The chassis as defined in claim 3 wherein the top portion includes pins slidably connected to the arcuate guides.

7. The chassis as defined in claim 4 wherein the engagement of the top portion of the cosmetic cover with the base portion of the cosmetic cover is maintained by a releasable latch.

8. The chassis as defined in claim 4 wherein the second computer components in the top portion of the metal chassis are cooled by a fan mounted in the base portion of the metal chassis, the fan being positioned adjacent the second computer components when the top portion of the metal chassis is in the closed position.

9. The chassis as defined in claim 4 wherein engagement of the top portion of the cosmetic cover with the base portion of the cosmetic cover is maintained by a latch on each side panel.

10. The chassis as defined in claim 5 wherein the gasket is compressed into the groove.

11. A computer chassis comprising:
   a base portion formed of a metal chassis and a base cosmetic cover;
   a top portion formed of a metal chassis and a top cosmetic cover;
   a plurality of first computer components mounted in the base portion of the metal chassis;
   a plurality of second computer components mounted in the top portion of the metal chassis;
   a pivotal connection between the top portion of the metal chassis and the base portion of the metal chassis;
   the top portion of the metal chassis being pivotable relative to the base portion of the metal chassis to an open position immediately exposing all of the first and second computer components for access, without removing any of the cosmetic covers;
   a tongue and groove edge connection between the top and base portions of the metal chassis; and
   an adhesive free gasket mounted in the groove for sealing engagement with the tongue.

12. The chassis as defined in claim 11 wherein the pivotal connection includes arcuate guides on the base portion.

13. The chassis as defined in claim 12 wherein the top portion of the metal chassis includes pins slidably connected to the arcuate guides.

14. A computer system comprising:
   a chassis having an internal computer component cavity defined therein;
   a microprocessor mounted in the chassis;
   a storage coupled to the microprocessor;
   a video controller coupled to the microprocessor;
   a memory coupled to the microprocessor;
   a base portion of the chassis formed of a metal portion and a base cosmetic cover;
   a top portion of the chassis formed of a metal portion and a top cosmetic cover;
   a plurality of first computer components mounted in the base portion of the metal chassis;
   a plurality of second computer components mounted in the top portion of the metal chassis;
   a pivotal connection between the top portion of the metal chassis and the base portion of the metal chassis;
   the top portion of the metal chassis and the top cosmetic cover being pivotable relative to the base portion of the metal chassis and the base cosmetic cover to an open position immediately exposing the cavity and the plurality of first and second computer components for access, without removing any of the cosmetic covers;
   a tongue and groove edge connection between the top and base portions of the metal chassis; and
   an adhesive free gasket mounted in the groove for sealing engagement with the tongue.

15. The system as defined in claim 14 the metal chassis base portion includes a first pair of opposed sidewalls and the metal chassis top portion includes a second pair of opposed sidewalls matingly engaged with the first pair of side walls.

16. The system as defined in claim 14 wherein the pivotal connection includes arcuate guides on the base portion.

17. The system as defined in claim 14 wherein the top and base portion of the cosmetic cover include panels which nest together when the top portion of the metal chassis is pivoted into engagement with the base portion of the metal chassis in a closed position, and wherein the first computer components are nested side-by-side with the second computer components when the top and base portions of the metal chassis are in the closed position.

18. The system as defined in claim 15 wherein one of the first and second pair of sidewalls includes the tongue and the other of the first and second pair of sidewalls includes the groove.

19. The system as defined in claim 16 wherein the top portion includes pins slidably connected to the arcuate guides.

20. The system as defined in claim 18 wherein the gasket is compressed into the groove.

* * * * *